(12) United States Patent
Yaguchi et al.

(10) Patent No.: US 8,878,144 B2
(45) Date of Patent: Nov. 4, 2014

(54) ELECTRON MICROSCOPE AND SAMPLE HOLDER

(75) Inventors: Toshie Yaguchi, Omitama (JP);
Yasuhira Nagakubo, Hitachinaka (JP);
Akira Watabe, Higashiibaraki (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/577,751

(22) PCT Filed: Dec. 1, 2010

(86) PCT No.: PCT/JP2010/006996
§ 371 (c)(1),
(2), (4) Date: Aug. 8, 2012

(87) PCT Pub. No.: WO2011/104801
PCT Pub. Date: Sep. 1, 2011

(65) Prior Publication Data
US 2012/0305769 A1    Dec. 6, 2012

(30) Foreign Application Priority Data

Feb. 24, 2010   (JP) ................................. 2010-038105

(51) Int. Cl.
*H01J 37/20* (2006.01)
*H01J 37/26* (2006.01)

(52) U.S. Cl.
CPC ........... *H01J 37/26* (2013.01); *H01J 2237/206* (2013.01); *H01J 2237/2003* (2013.01); *H01J 2237/2065* (2013.01); *H01J 2237/006* (2013.01); *H01J 37/20* (2013.01)

USPC ............... 250/441.11; 250/440.11; 250/443.1

(58) Field of Classification Search
USPC ............................. 250/440.11, 441.11, 443.1
See application file for complete search history.

(56) References Cited

U.S. PATENT DOCUMENTS

| 4,071,766 A | * | 1/1978 | Kalman et al. ............. 250/443.1 |
| 5,326,971 A | * | 7/1994 | Theodore et al. ............. 250/311 |
| 5,406,087 A | * | 4/1995 | Fujiyoshi et al. ........ 250/440.11 |
| 5,436,449 A | * | 7/1995 | Takahashi et al. ............. 250/311 |
| 7,544,954 B2 | * | 6/2009 | Chao et al. ............... 250/441.11 |
| 2004/0169143 A1 | * | 9/2004 | Kaji et al. ..................... 250/310 |

(Continued)

FOREIGN PATENT DOCUMENTS

| JP | 09-129168 A | 5/1997 |
| JP | 2000-133186 A | 5/2000 |
| JP | 2003-187735 A | 7/2003 |
| JP | 3610245 B2 | 10/2004 |

(Continued)

*Primary Examiner* — Michael Logie
(74) *Attorney, Agent, or Firm* — Mattingly & Malur, PC

(57) ABSTRACT

The electron beam apparatus sample holding means has a diaphragm which is placed on upper and lower sides of a sample to form a cell for separating a gas atmosphere and a vacuum atmosphere of a sample chamber and sealing an ambient atmosphere of the sample; a gas supply means for supplying gas to an inside of the cell; and exhaust means for exhausting gas. The exhaust means includes a gas exhaust pipe provided in the inside of the cell and an openable/closable exhaust hole provided in a sidewall of the sample holding means so as to pass through the cell. The diaphragm is an amorphous film made of light elements which can transmit an electron beam, such as carbon films, oxide films, and nitride films.

14 Claims, 5 Drawing Sheets

(56) References Cited

U.S. PATENT DOCUMENTS

2005/0230636 A1 10/2005 Tanaka et al.
2006/0076504 A1* 4/2006 de Jonge et al. ............ 250/423 F
2008/0093565 A1* 4/2008 Yaguchi et al. .......... 250/440.11
2009/0127474 A1* 5/2009 Tsuneta et al. ........... 250/442.11
2011/0303845 A1* 12/2011 Yaguchi et al. ................ 250/310

FOREIGN PATENT DOCUMENTS

| | | | | |
|---|---|---|---|---|
| JP | 2005190864 A | * | 7/2005 | .............. H01J 37/20 |
| JP | 2005-327710 A | | 11/2005 | |
| JP | 2009-117196 A | | 5/2009 | |
| JP | 2009-259760 A | | 11/2009 | |
| WO | 2010/092747 A1 | | 8/2010 | |

* cited by examiner

ELECTRON MICROSCOPE AND SAMPLE HOLDER

TECHNICAL FIELD

The present invention relates to an electron microscope and a sample holder used therefor.

BACKGROUND ART

There are growing needs for analyzing the structure and characteristics of substances not in vacuum but in a gas atmosphere and for performing in-situ observation of the synthetic process of the substances in the gas atmosphere with use of transmission electron microscopes (TEMs), scanning transmission electron microscopes (STEMs) and the like.

For observation in the gas atmosphere, there is a method as disclosed in Patent Literature 1 and Patent Literature 2, in which a sample holder includes a mechanism for holding a sample between two grids and introducing and exhausting gas into and from a space between the grids. There is another method as disclosed in Patent Literature 3 in which, in order to protect a diaphragm from pressure variations in the inside of a cell and to prevent gas diffusion, a sample is enclosed with a cell membrane and the membrane is provided with two holes which are covered with diaphragms so that an electron beam passes through the membrane. There is still another method as disclosed in Patent Literature 4 in which a sample holder has a dual-stage cell structure for preventing gas diffusion in the case where a diaphragms is damaged, the dual-stage cell structure having another diaphragms placed outside the cell formed from the diaphragms.

CITATION LIST

Patent Literature

Patent Literature 1: JP Patent Publication (Kokai) No. 2009-117196 A
Patent Literature 2: JP Patent Publication (Kokai) No. 9-129168 A (1997)
Patent Literature 3: U.S. Pat. No. 5,326,971
Patent Literature 4: JP patent No. 3610245

SUMMARY OF INVENTION

Technical Problem

In all of the above-stated conventional techniques, a gas exhaust pipe was provided in the inside of a cell which divides a gas atmosphere and a vacuum atmosphere. The exhaust pipe was connected to a vacuum pump to the outside of a column of the electron microscope, by which gas in the inside of the cell was exhausted. However, the exhaust pipe had a diameter as small as about several millimeters due to restriction by the size of the cell. Accordingly, the exhaust pipe had a large conductance and took time to discharge gas, which made it difficult to conduct gas displacement and made it also difficult to evacuate the cell to a degree of vacuum ($10^{-5}$ Pa) that is equivalent to that in an electron microscope sample chamber. It also took time to conduct the gas displacement.

In the case of using a sleeve having a removable cell membrane and a dual cell structure involving placement of a cell membrane in some of the above-stated conventional techniques, large dispersion of an electron beam caused a blurred image, resulting in deteriorated image quality.

Moreover, in all of the conventional techniques, consideration is not given to high temperature heating.

An object of the present invention is to provide a sample holding unit for an electron beam apparatus which can exhaust gas and replace with gas in the inside of a cell in a short time, easily cover a wide range of gas pressures in the inside of the cell from a degree of vacuum ($10^{-5}$ Pa) equivalent to that in an electron microscope sample chamber to the atmospheric pressure ($10^5$ Pa), and which allows observation of a reaction between a sample and gas under a wide range of gas pressures without damaging a diaphragm for use in the cell. Another object of the present invention is to provide a sample holding unit for an electron beam apparatus which allows high-temperature observation of a sample under any gas environment.

Solution to Problem

In order to solve one of the above-stated problems, in the present invention, an electron beam apparatus having a function of separately exhausting gas from an electron beam irradiation section, a sample chamber, and an observation chamber in a column includes: sample holding means in which a diaphragm is placed on an upper and lower sides of a sample to form a cell for separating a gas atmosphere and a vacuum atmosphere of the sample chamber and sealing an, atmosphere around the sample; gas supply means for supplying gas to an inside of the cell; and exhaust means for exhausting gas. The exhaust means includes a gas exhaust pipe provided in the inside of the cell and an openable/closable exhaust hole provided in a sidewall of the sample holding means so as to pass through the cell.

The diaphragm is an amorphous film made of light elements which can transmit an electron beam, such as carbon films, oxide films, and nitride films.

Advantageous Effects of Invention

According to the present invention, a minute gas space (environmental cell) of atmospheric gas for enclosing a sample with the diaphragm is formed in the inside of the sample chamber, so that gas can be exhausted and replaced with gas in the inside of the cell in a short time and a reaction between the sample and gas can be observed under a wide range of gas pressures with use of the electron beam apparatus.

DESCRIPTION OF EMBODIMENTS

Figure 1:
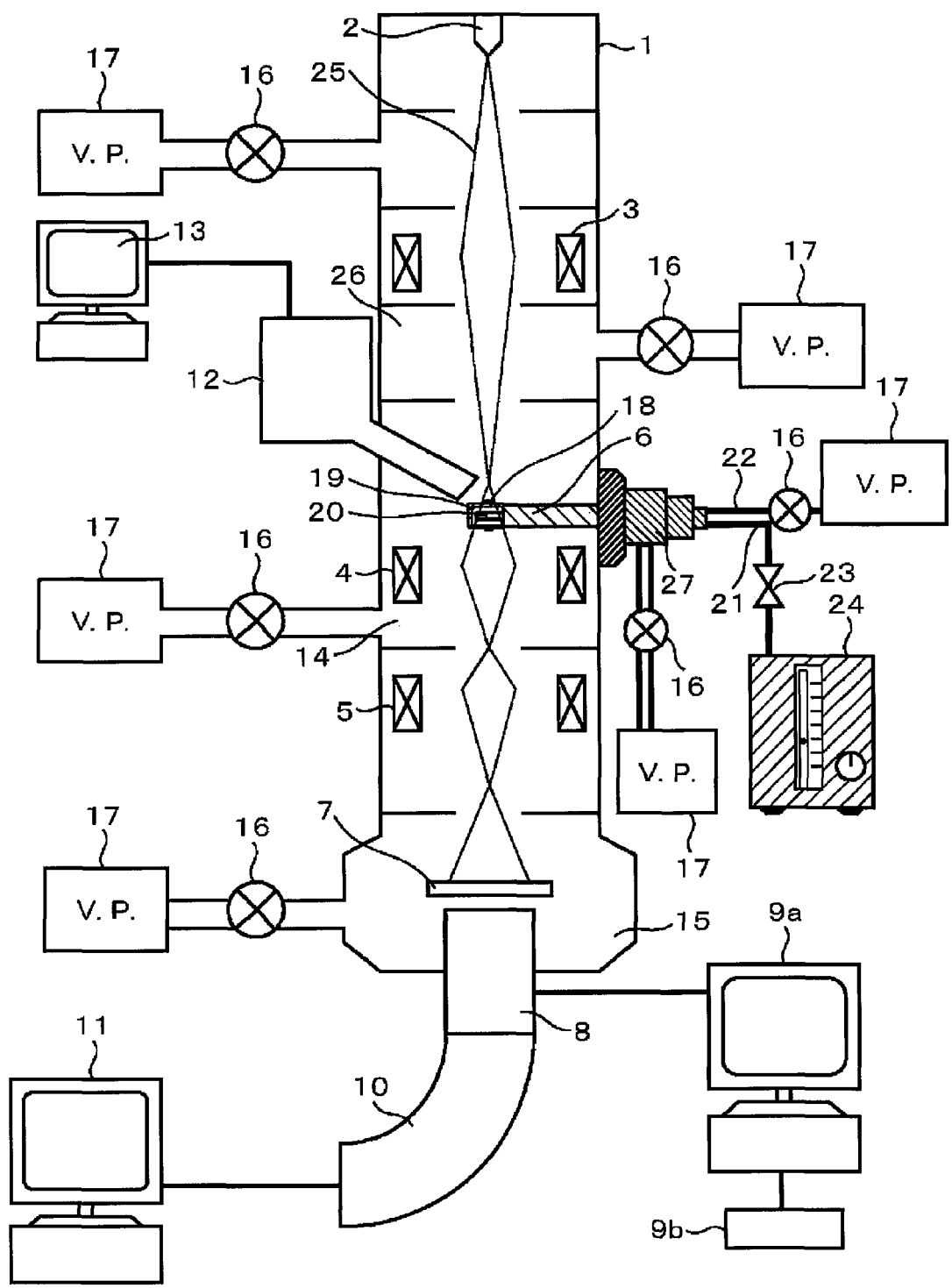
FIG. 1 is a basic structure view of an electron beam apparatus 1 and a sample holding unit for the electron beam apparatus 6 in one embodiment of the present invention.

FIG. 1 shows a basic structure view of an electron beam apparatus 1 and a sample holding unit for the electron beam apparatus 6 in one embodiment of the present invention. A column of the electron beam apparatus 1 includes an electron gun 2, a condenser lens 3, an objective lens 4, and a projector lens 5. The sample holding unit for the electron beam apparatus 6 is inserted in between the condenser lens 3 and the objective lens 4. A fluorescent screen 7 is mounted below the projector lens 5, and a TV camera 8 is mounted below the fluorescent screen 7. The TV camera 8 is connected to an image recording section 9b via an image display section 9a. An EELS detector 10 is mounted on the lower side of the TV camera 8 and is connected to an EELS control section 11. An EDX detector 12 is set above the sample holding unit for the electron beam apparatus 6, and is connected to an EDX control section 13.

Vacuum pumps 17 are connected to the vicinity of the electron gun 2, the vicinity of the condenser lens 3, the electron beam apparatus sample chamber 14, and an observation chamber 15 via valves 16, respectively. The sample holding unit for the electron beam apparatus 6 has a cell 19 sealed with a diaphragm 18 which is formed from an amorphous material such as carbon, oxide and nitride. The cell 19 has a sample 20 loaded therein and also has a top end portion of a gas introducing pipe 21 and a top end portion of a gas exhaust pipe 22 inserted therein. The electron beam apparatus sample chamber 14 is connected to a preliminary sample evacuation chamber 27, and the preliminary sample evacuation chamber 27 is connected to a vacuum pump 17 via a valve 16.

The gas introducing pipe 21 is connected to a gas storage section 24 via a gas pressure control valve 23. The gas exhaust pipe 22 is connected to a vacuum pump 17 via a valve 16.

An electron beam 25 emitted from the electron gun 2 is focused by the condenser lens 3 and is applied to the sample 20. The electron beam 25 which transmitted the sample 20 is imaged by the objective lens 4, and the image is magnified by the projector lens 5 and projected onto the fluorescent screen 7. Alternatively, the fluorescent screen 7 is lifted to project the transmitted image on the TV camera 8, so that the image is displayed on the image display section 9a and is recorded on the image recording section 9b.

When the sample holding unit for the electron beam apparatus 6 is inserted into the electron beam apparatus sample chamber 14, a top end portion of the sample holding unit for the electron beam apparatus 6 is put in the preliminary sample evacuation chamber 27 in advance for gas exhaust and is then inserted into the electron beam apparatus sample chamber 14.

Figure 2:
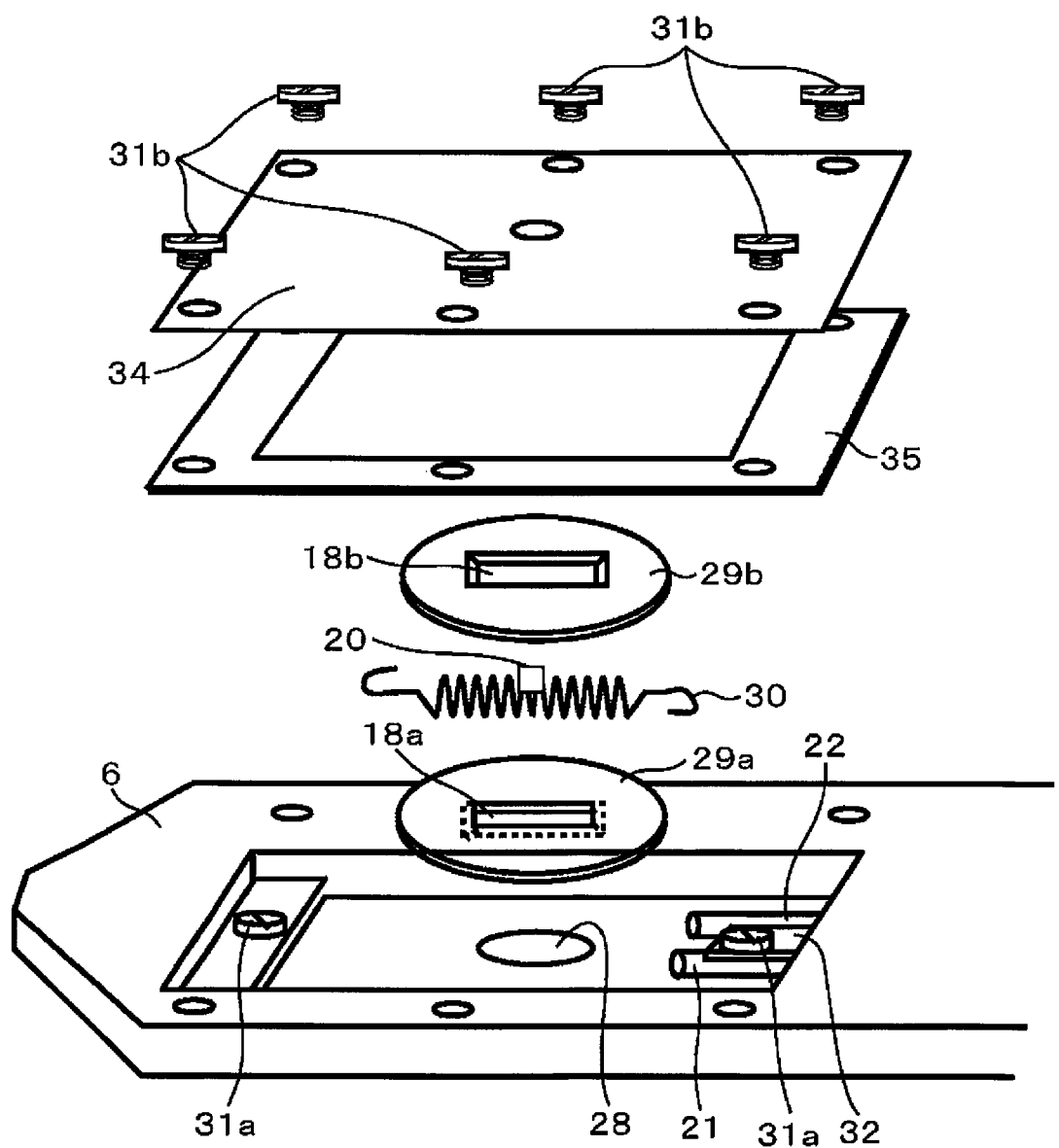
FIG. 2 is a structure view of a top end of the sample holding unit for the electron beam apparatus 6 in one embodiment.

FIG. 2 shows a structure view of the top end of the sample holding unit for the electron beam apparatus 6 in one embodiment. The sample holding unit for the electron beam apparatus 6 has an electron beam transmission hole 28 for passing the electron beam 25 therethrough. A lower diaphragm support plate 29a having a lower diaphragm 18a bonded thereto is mounted on the sample holding unit 6 so that the electron beam transmission hole 28 is covered with the lower diaphragm support plate 29a. The lower diaphragm support plate 29a is fixed without any gap with use of adhesives and the like so that gas does not pass through the gap. Above the lower diaphragm support plate 29a, a heater 30 is fixed in a floating state with both ends thereof being screwed with heater fixing screws 31a so that the heater 30 does not come into contact with the lower diaphragm 18a. One side of the heater 30 screwed with the heater fixing screw 31a is connected to a lead wire 32, and the lead wire 32 is connected to a heating source 33 which is in the outside of the column of the electron beam apparatus 1. The sample 20 is directly applied to the heater 30. An upper diaphragm support plate 29b is fixed to a pressing plate 34 without any gap with use of adhesives and the like. The pressing plate 34 is screwed to the sample holding unit for the electron beam apparatus 6 with screws 31b via a gasket 35. Thus, the cell 19 is formed which can seal the sample 20 and a surrounding area of the sample 20. The cell 19 has the top end portions of the gas introducing pipe 21 and the gas exhaust pipe 22 inserted therein, so that any gas can be introduced to or exhausted from the inside of the cell 19. Accordingly, it becomes possible to heat the sample 20 in any gas atmosphere and to directly observe a changing process thereof.

In this embodiment, the lower diaphragm support plate 29a and the upper diaphragm support plate 29b are fixed with use of adhesives. However, they may be structured to be directly screwed to the sample holding unit for the electron beam apparatus 6 via gaskets.

Also in this embodiment, the heater 30 is placed in the inside of the cell 19 and the sample 20 is directly applied to the heater 30 so that the sample 20 can be heated in the inside of the cell 19. However, it may be possible to set a general electron microscope sample stand such as a 3 mm-mesh instead of using the heater 30.

Figure 3:
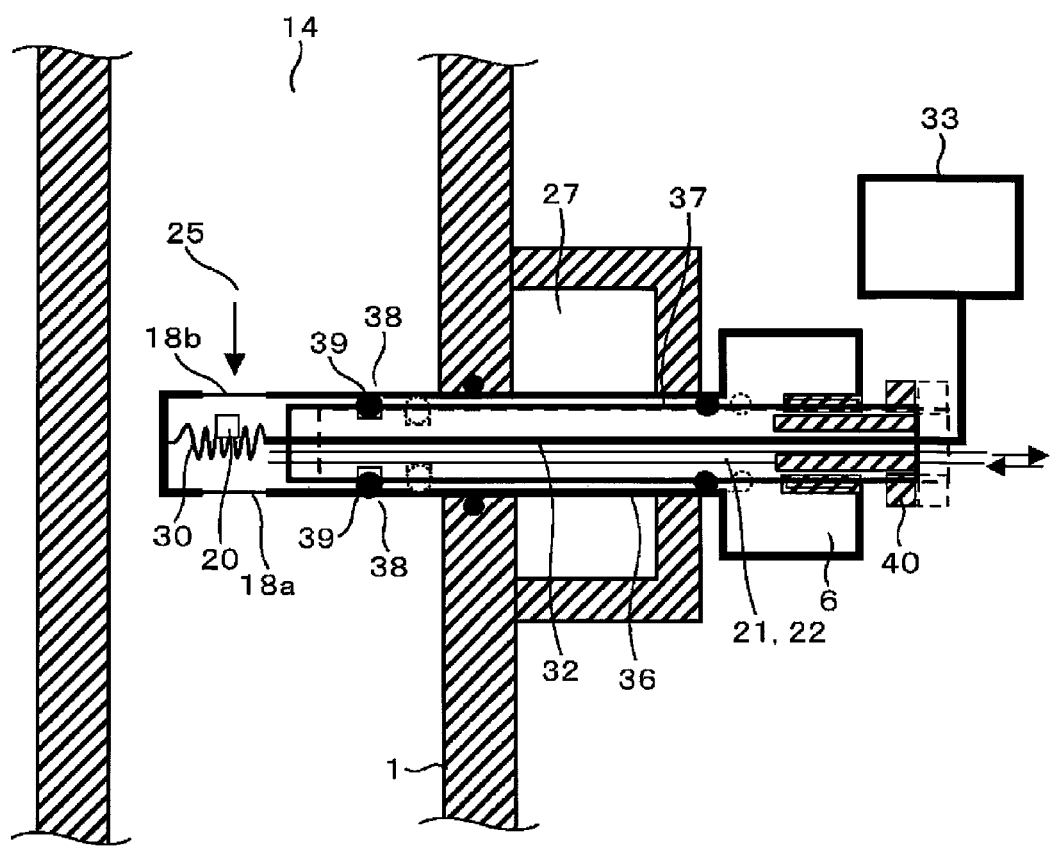
FIG. 3 is a structure view of an electron beam apparatus sample chamber 14 and the sample holding unit for the electron beam apparatus 6 in one embodiment.

FIG. 3 shows a structure view of the electron beam apparatus sample chamber 14 and the sample holding unit for the electron beam apparatus 6 in one embodiment. The electron beam apparatus sample chamber 14 adjoins to the preliminary sample exhaust chamber 27, which is connected to a vacuum exhaust pump 17 so that preliminary exhaust can be performed when the sample holding unit for the electron beam apparatus 6 is inserted into or taken out of the electron beam apparatus sample chamber 14. Since the environmental cell 19 is formed with the lower diaphragm 18a and the upper diaphragm 18b at the top end of the sample holding unit for the electron beam apparatus 6, an environment different from that of the electron beam apparatus sample chamber 14 can be formed at the top end portion of the sample holding unit for the electron beam apparatus 6. The sample 20 is mounted on the heater 30 in the inside of the cell 19, and the heater 30 is connected to the heating source 33 via the lead wire 32. Accordingly, it becomes possible to heat the sample 20 while controlling the environment in the inside of the cell 19.

A shaft portion of the sample holding unit for the electron beam apparatus 6 includes an outer shaft 36 and a center shaft 37 which can move in a horizontal direction. Exhaust holes 38 are provided in a lateral surface of the outer shaft 36. O rings 39 are set in the center shaft 37 so that the exhaust holes 38 of the outer shaft 36 can be closed. The center shaft 37 is connected to a center shaft drive tab 40 which is in the outside of the column of the electron beam apparatus 1. As the center shaft drive tab 40 is rotated, the center shaft 37 can be operated in the horizontal direction. As the center shaft 37 moves, the positions of the O rings 39 shift from the exhaust holes 38 of the outer shaft 36. As a result, the inside of the environmental cell 19 communicates with the exhaust hole 38. Since gas in the electron beam apparatus sample chamber 14 is exhausted with the vacuum pump 17, simultaneous exhaust through the gas exhaust pipe 22 and the exhaust hole 38 becomes possible. This makes it possible to exhaust gas in the inside of the cell 19 in a short time. In this embodiment, two exhaust holes 38 are provided. However, two or more exhaust holes 38 may be provided, or when the capacity of the cell 19 is small, one exhaust hole 38 may be provided.

After the gas in the cell 19 is exhausted through the exhaust holes 38 and the gas exhaust pipe 22, the center shaft 37 is horizontally operated so that the positions of the O rings 39 move to the positions of the exhaust holes 38 of the outer shaft 36. As a result, the inside of the environmental cell 19 is sealed. Then, gas is introduced through the gas introducing pipe 21, and the gas pressure is controlled to obtain a target pressure. The temperature of the sample 20 is controlled and set by adjusting the heating temperature of the heater 30. The change thereof is observed with use of an electron beam 25 which has transmitted the diaphragm 18.

The gas in the cell 19 may be exhausted not by using the electron beam apparatus sample chamber 14 but by setting the positions of the exhaust holes 38 to be at the preliminary sample evacuation chamber 27, opening the exhaust holes 38, and exhausting the gas in the preliminary sample evacuation chamber 27 so that the gas in the inside of the cell 19 is exhausted through the exhaust holes 38.

For example, at the time of inserting the sample holding unit for the electron beam apparatus 6 into the column of the electron beam apparatus 1, if the top end portion of the sample holding unit for the electron beam apparatus 6 is inserted into the preliminary sample evacuation chamber 27 and gas in the preliminary sample evacuation chamber 27 is exhausted while the inside of the cell 19 is at the atmospheric pressure, then rapid pressure change affects the diaphragm 18, and thereby the diaphragm 18 is damaged. Accordingly, prior to start preliminary exhaust, it is necessary to exhaust gas from the cell 19 of the sample holding unit for the electron beam apparatus 6 through the gas exhaust pipe 22 in the inside of the cell 19. However, the gas exhaust pipe 22 has a diameter of 1 mm or less so as to be fitted into the sample holding unit for the electron beam apparatus 6, and so the gas exhaust pipe 22 has a large conductance, takes time to discharge gas, and is not efficient. Accordingly, the gas in the preliminary sample evacuation chamber 27 is exhausted while the exhaust holes 38 are opened, so that the gas inside the cell 19 is directly exhausted, the pressure applied to the diaphragm 18 is reduced, and the diaphragm 18 is protected.

Figure 4:
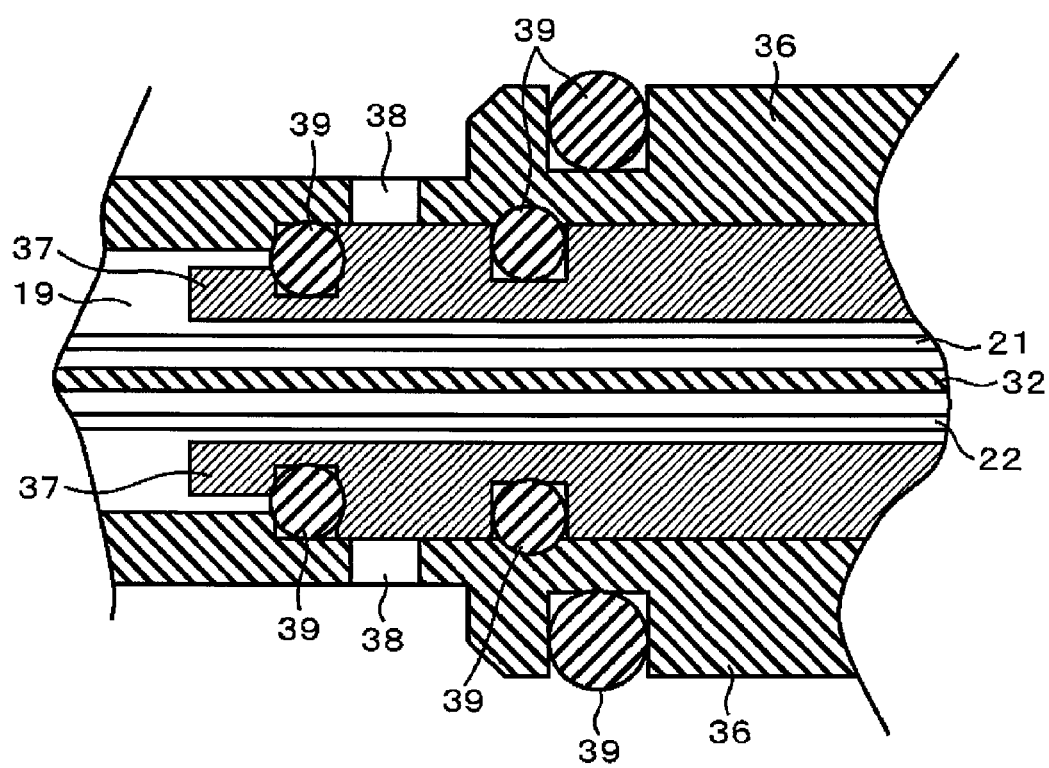
FIG. 4 is a cross sectional view of an area in the vicinity of an exhaust hole 38 of the sample holding unit for the electron beam apparatus 6 in one embodiment.

FIG. 4 shows a cross sectional view of an area in the vicinity of the exhaust hole 38 of the sample holding unit for the electron beam apparatus 6 in one embodiment. In the sample holding unit for the electron beam apparatus 6, the exhaust holes 38 are provided in the outer shaft 36. The O rings 39 are mounted on the portions which come into contact with the mirror body of the electron beam apparatus 1, so that the electron beam apparatus sample chamber 14 is maintained in vacuum. The center shaft 37 portion is connected to the center shaft drive tab 40 which is hollow and movable in the horizontal direction and which is in the outside of the mirror body of the electron beam apparatus 1. As the center shaft drive tab 40 is rotated, the center shaft 37 can be operated in the horizontal direction. The O rings 39 are set in the center shaft 37 so that the outer shaft 36 and the exhaust holes 38 can be closed. The center shaft 37 is hollow, so that the lead wire 32, the gas introducing pipe 21, and the gas exhaust pipe 22 pass through the center shaft 37. One end of the lead wire 32 is connected to the heater 30 in the inside of the cell 19, while the other end is connected to the heating source 33 which is in the outside of the column of the electron beam apparatus 1. The gas introducing pipe 21 is connected to the gas storage section 24 via the gas pressure control valve 23 which is in the outside of the mirror body of the electron beam apparatus 1. The gas exhaust pipe 22 is connected to the vacuum pump 17, which is in the outside of the column of the electron beam apparatus 1, via the valve 16. As the center shaft drive tab 40 is rotated, the center shaft 37 is further driven in the horizontal direction, so that the positions of the O rings 39 shift from the exhaust holes 38 of the outer shaft 36. As a result, the inside of the environmental cell 19 communicates with the exhaust hole 38. Since gas in the electron beam apparatus sample chamber 14 is exhausted with the vacuum pump 17, simultaneous exhaust through the gas exhaust pipe 22 and the exhaust hole 38 becomes possible. This makes it possible to exhaust gas in the inside of the cell 19 in a short time. In this embodiment, two exhaust holes 38 are provided. However, two or more exhaust holes 38 may be provided, or when the capacity of the cell 19 is small, one exhaust hole 38 may be provided.

Figure 5:
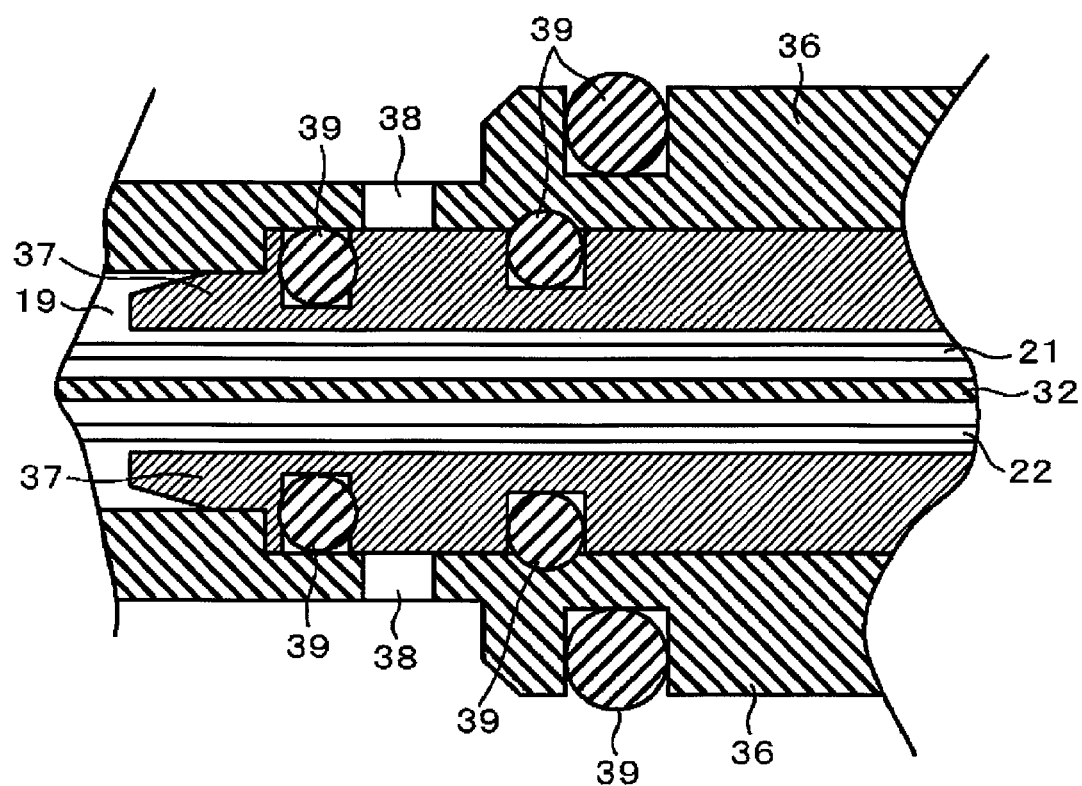
FIG. 5 is a cross sectional view of an area in the vicinity of the exhaust hole 38 of the sample holding unit for the electron beam apparatus 6 in one embodiment.

FIG. 5 shows a cross sectional view of an area in the vicinity of the exhaust hole 38 of the sample holding unit for the electron beam apparatus 6 in another embodiment. A top end portion of the center shaft 37 in FIG. 5, which is different from that in FIG. 4, may be formed into a tapered shape so as to have a function as a needle valve which allows fine adjustment of the amount of exhaust in the inside of the cell 19.

By combining the foregoing structures, precise control can be performed on a wide range of pressures inside the environmental cell 19, and the pressure applied to the diaphragm 18 can be adjusted when the sample holding unit 6 is inserted into and taken out of the electron beam apparatus 1. This makes it possible to prevent the diaphragm 18 from being damaged by the rapid pressure change, and thereby a thinner diaphragm 18 becomes applicable. Therefore, a reaction process in a gas atmosphere, such as a crystal growth process by a high-temperature gas reaction and an oxidation-reduction reaction process, can be observed at high resolution.

REFERENCE SIGNS LIST

1 Electron beam apparatus
2 Electron gun
3 Condenser lens
4 Objective lens
5 Projector lens
6 Sample holding unit for electron beam apparatus
7 Fluorescent screen
8 TV camera
9a Image display section
9b Image recording section
10 EELS detector
11 EELS control section
12 EDX detector
13 EDX control section
14 Electron beam apparatus sample chamber
15 Observation chamber
16 Valve
17 Vacuum pump
18a Lower diaphragm
18b Upper diaphragm
19 Cell
20 Sample
21 Gas introducing pipe
22 Gas exhaust pipe
23 Gas pressure control valve
24 Gas storage section
25 Electron beam
26 Intermediate chamber
27 Preliminary sample evacuation chamber
28 Electron beam transmission hole
29a Lower diaphragm support plate
29b Upper diaphragm support plate
30 Heater
31a Heater fixing screw
31b Screw
32 Lead wire
33 Heating source
34 Pressing plate
35 Gasket
36 Outer shaft
37 Center shaft
38 Exhaust hole
39 O ring
40 Center shaft drive tab

The invention claimed is:

1. An electron microscope, comprising:
a sample holder for holding a sample;
a sample chamber for maintaining a surrounding area of the sample in a vacuum atmosphere;
an electron beam control unit for focusing an electron beam emitted from an electron source which emits a primary electron beam and irradiating the sample with the electron beam;
a detector for detecting electrons generated from the sample;
a sample image control unit for forming a sample image relating to the sample based on a signal from the detector;
a display unit for displaying the sample image;
a recording unit for recording the sample image;
a cell which includes diaphragms placed relative to upper and lower sides of the sample, which is held on the sample holder, for separating the vacuum atmosphere and a gas atmosphere of the sample chamber;
a gas supply unit for supplying gas to an inside of the cell; and
a gas exhaust unit for exhausting the gas from the inside of the cell,
wherein:
the gas exhaust unit includes a gas exhaust pipe provided in the inside of the cell and an exhaust hole provided in a sidewall of the sample holder,
the exhaust hole is positioned in the inside of the sample chamber when the sample holder is inserted,
the sample holder includes a seal member for sealing the exhaust hole,
the exhaust hole is opened and closed by contact with the seal member as the sample holder moves, and
the gas in the inside of the cell can be exhausted through both the gas exhaust pipe and the exhaust hole when the sample holder is inserted into or taken out of the sample chamber.

2. The electron microscope according to claim 1, comprising:
a pressure control unit for controlling pressure of the gas in the inside of the cell; and
a heating unit for heating the sample in the inside of the cell.

3. The electron microscope according to claim 1, wherein the exhaust hole provided in the sidewall of the sample holder is a singular hole.

4. The electron microscope according to claim 1, wherein the exhaust hole provided in the sidewall of the sample holder as one of a plurality of exhaust holes provided in the sidewall of the sample holder.

5. The electron microscope according to claim 1, wherein the sample holder includes:
a shaft having an outer shaft and a center shaft, the outer shaft including the sidewall and the exhaust hole provided thereon; and
a needle valve is provided on a center shaft of the sample holder so as to control a flow rate of the gas at a time of opening and closing the exhaust hole.

6. A sample holder for holding a sample for use in an electron microscope which irradiates the sample with an electron beam to detect electrons generated on the sample and to form an image, comprising:
a cell which includes diaphragms placed relative to upper and lower sides of the sample for separating a vacuum atmosphere and a gas atmosphere;
a gas exhaust pipe provided in an inside of the cell; and
an exhaust hole provided in a casing of the cell that has the diaphragms coupled thereto,
wherein:
the exhaust hole is positioned in the inside of the sample chamber when the sample holder is inserted,
the sample holder includes a seal member for sealing the exhaust hole,
the exhaust hole is opened and closed by contact with the seal member as the sample holder moves, and
gas in the inside of the cell can be exhausted through both the gas exhaust pipe and the exhaust hole when the cell is inserted into or taken out of the vacuum atmosphere.

7. The sample holder according to claim 6, comprising a heating unit provided in the inside of the cell for heating the sample.

8. The sample holder according to claim 6, wherein the exhaust hole is a singular hole.

9. The sample holder according to claim 6, wherein the exhaust hole is a plurality of holes.

10. The sample holder according to claim 6, further comprising:
a shaft having an outer shaft and a center shaft, the outer shaft having the exhaust hole provided thereon; and
a needle valve disposed on the center shaft so as to control a flow rate of the gas at a time of opening and closing the exhaust hole.

11. An electron microscope, comprising:
a sample holder for holding a sample;
a sample chamber for maintaining a surrounding area of the sample in a vacuum atmosphere;
an electron beam control unit for focusing an electron beam emitted from an electron source which emits a primary electron beam and irradiating the sample with the electron beam;
a detector for detecting electrons generated from the sample;
a sample image control unit for forming a sample image relating to the sample based on a signal from the detector;
a display unit for displaying the sample image;
a recording unit for recording the sample image;
a cell which includes diaphragms placed relative to upper and lower sides of the sample, which is held on the sample holder, for separating the vacuum atmosphere and a gas atmosphere of the sample chamber;
a gas supply unit for supplying gas to an inside of the cell; and
a gas exhaust unit for exhausting the gas from the inside of the cell,
wherein:
the gas exhaust unit includes a gas exhaust pipe provided in the inside of the cell and an openable and closeable exhaust hole provided in a sidewall of the sample holder so as to pass through the cell, and gas in the inside of the cell can be exhausted through both the gas exhaust pipe and the exhaust hole, and
the sample holder has a shaft, the shaft has an outer shaft and a center shaft and the outer shaft has the exhaust hole provided thereon so that gas in the inside of the cell is exhausted as the center shaft moves.

12. The electron microscope according to claim 11, wherein
a needle valve is provided on the center shaft of the sample holder so as to control a flow rate of the gas at a time of opening and closing the exhaust hole.

13. A sample holder for holding a sample for use in an electron microscope which irradiates the sample with an electron beam to detect electrons generated on the sample and to form an image, comprising:
- a cell which includes diaphragms placed relative to upper and lower sides of the sample for separating a vacuum atmosphere and a gas atmosphere;
- a gas exhaust pipe provided in an inside of the cell; and
- an openable and closeable exhaust hole provided so as to pass through the cell; and
- a shaft having an outer shaft and a center shaft, the outer shaft having the exhaust hole provided thereon,
- wherein gas in the inside of the cell can be exhausted through both the gas exhaust pipe and the exhaust hole as the center shaft moves.

14. The sample holder according to claim 13, wherein
- a needle valve is provided on the center shaft so as to control a flow rate of the gas at a time of opening and closing the exhaust hole.

* * * * *